United States Patent
Chang et al.

(10) Patent No.: US 8,840,262 B2
(45) Date of Patent: Sep. 23, 2014

(54) LED AND BACKLIGHT MODULE USING THE SAME

(75) Inventors: Chao-Hsiung Chang, Hsinchu (TW); Hou-Te Lin, Hsinchu (TW)

(73) Assignee: Advanced Optoelectronic Technology, Inc., Hsinchu Hsien (TW)

(*) Notice: Subject to any disclaimer, the term of this patent is extended or adjusted under 35 U.S.C. 154(b) by 170 days.

(21) Appl. No.: 13/559,614

(22) Filed: Jul. 27, 2012

(65) Prior Publication Data

US 2013/0135844 A1 May 30, 2013

(51) Int. Cl.
*H01L 33/46* (2010.01)

(52) U.S. Cl.
USPC .......... 362/97.3; 362/297; 362/346; 362/304; 257/98

(58) Field of Classification Search
USPC ............... 362/97.3, 97.1, 304, 346, 330, 297, 362/800, 341, 347, 350, 296.01, 296.05; 257/98, 100, E33.068
See application file for complete search history.

(56) References Cited

U.S. PATENT DOCUMENTS

| | | | | |
|---|---|---|---|---|
| 6,578,998 B2 * | 6/2003 | Zhang | | 362/555 |
| 6,641,287 B2 * | 11/2003 | Suehiro | | 362/298 |
| 6,672,741 B1 * | 1/2004 | Young | | 362/311.02 |
| 6,722,777 B2 * | 4/2004 | Erber | | 362/518 |
| 6,886,962 B2 * | 5/2005 | Suehiro | | 362/241 |
| 7,070,304 B2 * | 7/2006 | Imai | | 362/267 |
| 7,850,345 B2 * | 12/2010 | Holder et al. | | 362/347 |
| 8,277,085 B2 * | 10/2012 | Falicoff et al. | | 362/296.01 |
| 8,425,101 B2 * | 4/2013 | Boonekamp | | 362/609 |
| 2002/0149942 A1 * | 10/2002 | Suehiro | | 362/298 |
| 2006/0164836 A1 * | 7/2006 | Suehiro et al. | | 362/294 |
| 2010/0177497 A1 * | 7/2010 | Leung et al. | | 362/84 |

* cited by examiner

*Primary Examiner* — Bao Q Truong
(74) *Attorney, Agent, or Firm* — Novak Druce Connolly Bove + Quigg LLP

(57) ABSTRACT

An LED includes a base, an LED chip, a first electrode, a second electrode, an encapsulating layer, and a reflective layer. The base forms a concave recessed from a top face thereof and a recess above the concave. The reflective layer is attached on the concave. The LED chip is received in the recess and located over the reflective layer. The LED chip has a light output face facing towards the reflective layer. The encapsulating layer is filled in the recess to cover the reflective layer and encapsulate the LED chip. The reflective layer includes a first reflective layer and a second reflective layer. The first reflective layer is located at a center of the concave. The second reflective layer surrounds and connects the first reflective layer. The first reflective layer has a curvature smaller than that of the second reflective layer.

19 Claims, 5 Drawing Sheets

US 8,840,262 B2

LED AND BACKLIGHT MODULE USING THE SAME

BACKGROUND

1. Technical Field

The present disclosure relates to an LED (light emitting diode) and a backlight module using the same, wherein the LED has intensive light output at side directions thereof.

2. Description of Related Art

Nowadays, an LED has many advantages, e.g., energy saving and longer life-span, compared to conventional light sources. Therefore, the LEDs are widely used in backlight modules. A conventional backlight module includes a backboard and a plurality of LEDs positioned on the backboard densely. Because the LEDs each have weak light output at side directions thereof, a distance between two adjacent LEDs is small, and a large number of the LEDs is accordingly needed. When the LEDs emit light, a large amount of heat is generated from the intensively arranged LEDs which is difficult to be dissipated timely and would be unavoidably accumulated in the backlight module. The large number of LEDs is costly. Furthermore, the heat generated by the large number of LEDs which cannot be dissipated timely affects the quality of the backlight module.

What is needed, therefore, is an LED and a backlight module using the same which can overcome the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
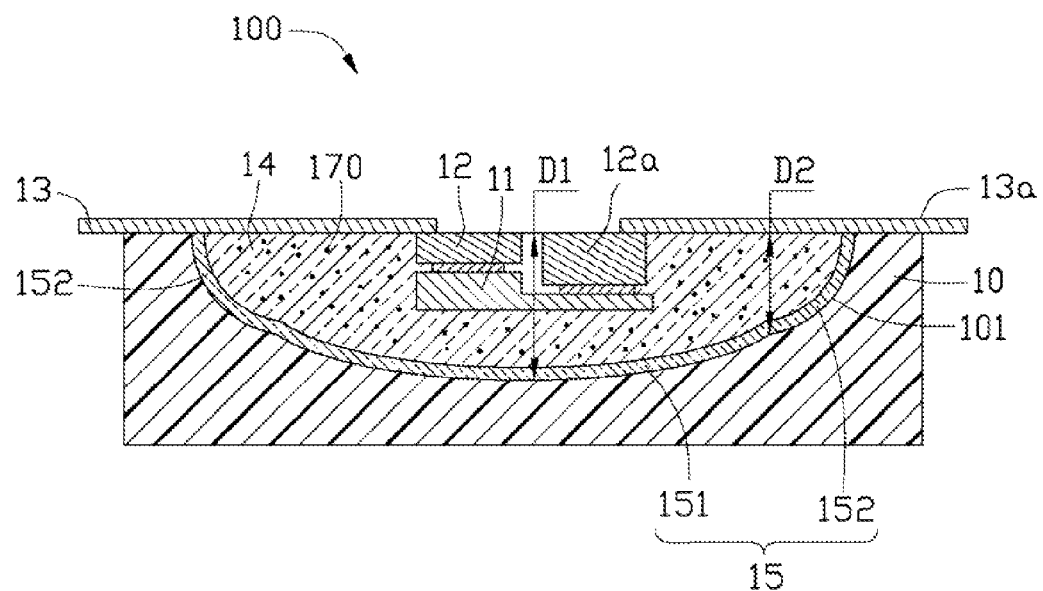
FIG. 1 is a cross-sectional view of an LED in accordance with an embodiment of the disclosure.
Figure 2:
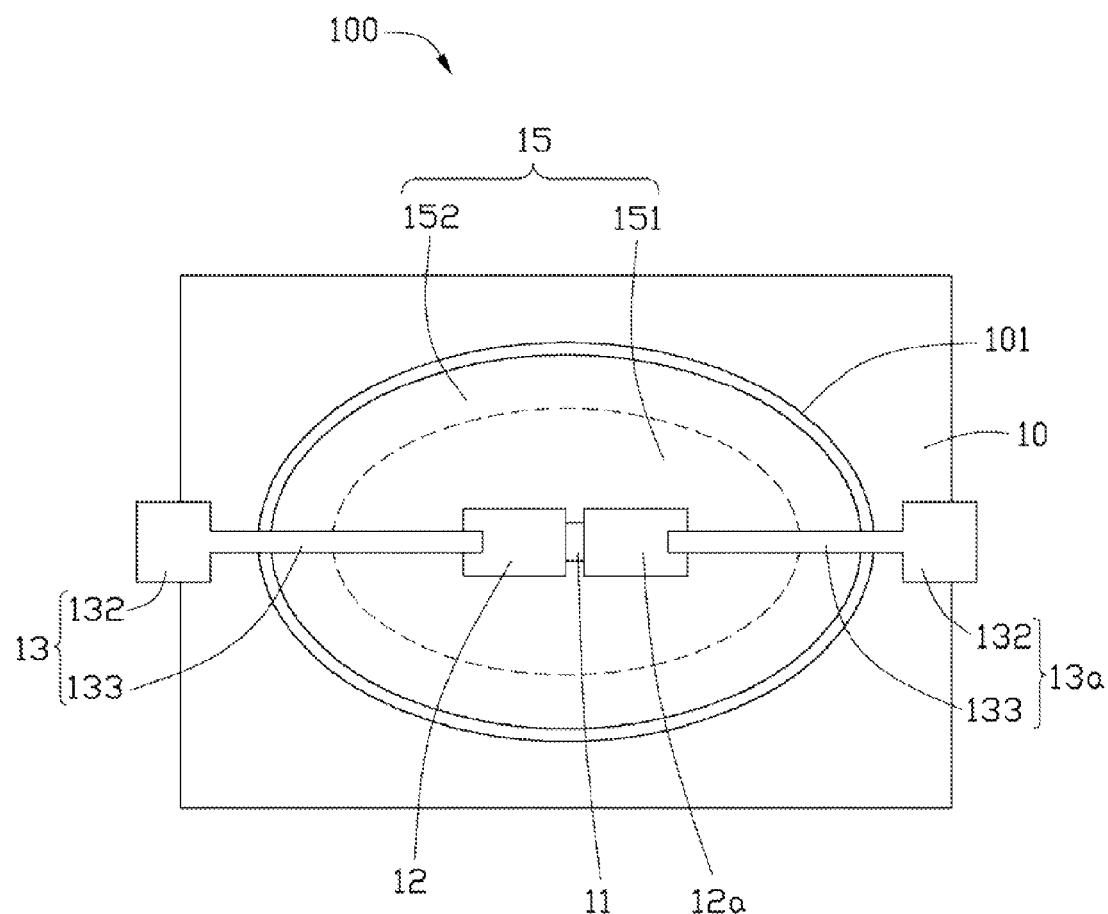
FIG. 2 is a top plan view of the LED of FIG. 1.

Referring to FIGS. 1-2, an LED 100 in accordance with an embodiment of the disclosure includes a base 10, an LED chip 11, a first connecting member 12, a second connecting member 12a, a first electrode 13, a second electrode 13a, an encapsulating layer 14, and a reflective layer 15.

The base 10 forms a concave 101 recessed from a top face thereof. A recess 102 is defined in the top face of the base 10 above the concave 101. The reflective layer 15 is attached on the concave 101 in the base 10. The reflective layer 15 includes a first reflective layer 151 and a second reflective layer 152. The first reflective layer 151 is located at a center of the concave 101. The second reflective layer 152 is located at a side of the first reflective layer 151 and surrounds and connects the first reflective layer 151. The first reflective layer 151 and the second reflective layer 152 are arc-shaped. The first reflective layer 151 has a curvature smaller than that of the second reflective layer 152. A distance D1 between a center of the first reflective layer 151 and the top face of the base 10 is not less than a distance D2 between an edge of the second reflective layer 152 adjacent the first reflective layer 151 and the top face of the base 10. The distance between the first reflective layer 151 and the top face of the base 10 gradually decreases from the center of the first reflective layer 151 to a periphery of the first reflective layer 151. The distance between the second reflective layer 152 and the top face of the base 10 gradually decreases along a direction away from the first reflective layer 151. The distance between the first reflective layer 151 and the top face of the base 10 has the minimum value at a point where the first reflective layer 151 and the second reflective layer 152 intersect; the distance between the second reflective layer 152 and the top face of the base 10 has the maximum value at the point where the first reflective layer 151 and the second reflective layer 152 intersect.

The first electrode 13 and the second electrode 13a, are positioned on the top face of the base 10. Each of the first electrode 13 and the second electrode 13a, includes a first section 132 and a second section 133. The first sections 132 are located at two opposite sides of the base 10 outside the concave 101. The second sections 133 extend from the first sections 132 to a center of an opening above the concave 101, and are spaced from each other. The second section 133 has a width smaller than that of the first section 132 for preventing the first and second electrodes 13, 13a, from blocking light emitted from the LED chip 11, whereby the light emitted from the LED chip 11 can radiate out of the LED 10 as much as possible. The first connecting member 12 and the second connecting member 12a, are electrically connected to bottom faces of distal ends of the second sections 133, respectively.

The LED chip 11 is received in the recess 102 and located above the center of the concave 101. The LED chip 11 is spaced from the reflective layer 15. The LED chip 11 has a light output face facing towards the reflective layer 15. A position of the LED chip 11 deviates from a focus of the first reflective layer 151 to avoid the LED chip 11 from blocking light emitted from the LED chip 11 to radiate out of the LED 100. The LED chip 11 is electrically connected to the first connecting member 12 and the second connecting member 12a.

The encapsulating layer 14 is filled in the recess 102 to cover the reflective layer 15 and encapsulate the LED chip 11 and the first and second connecting members 12, 12a. The encapsulating layer 14 has a light output face coplanar with the top face of the base 10. Fluorescent powders 170 are mixed into the encapsulating layer 14 for altering the color of the light from the LED chip 11 to a desired color.

Figure 3:
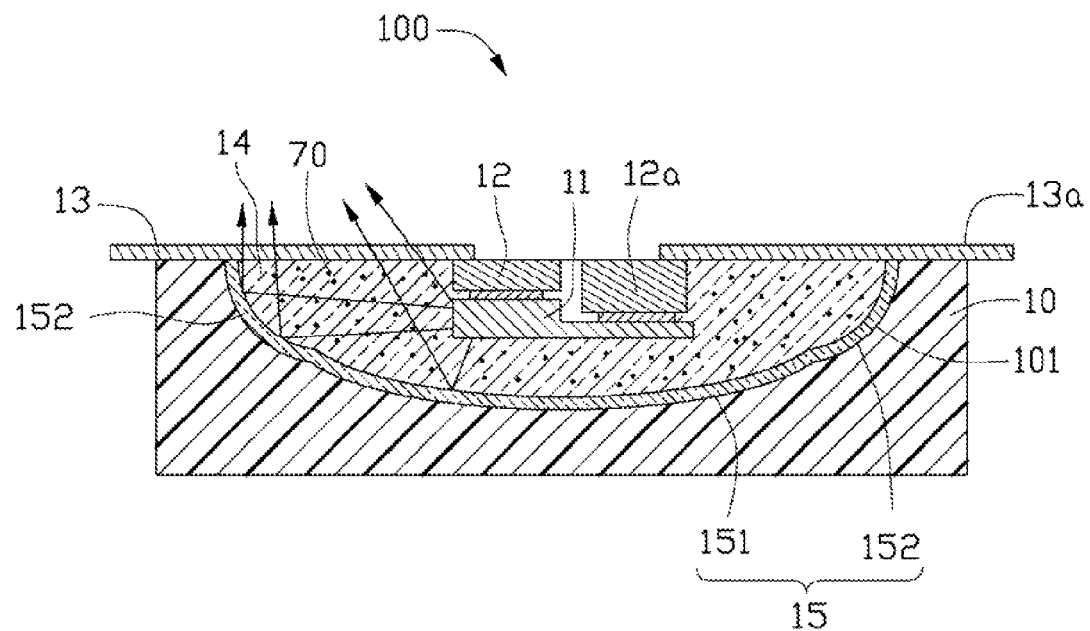
FIG. 3 is a view similar to FIG. 1, with arrows representing light rays generated by the LED.

Referring to FIG. 3, when the LED chip 11 emits light, one part of the light emitted from the LED chip 11 is reflected out of the LED 100 by the first reflective layer 151, and another part of light emitted from the LED chip 11 is reflected out of the LED 100 by the second reflective layer 152.

Figure 4:
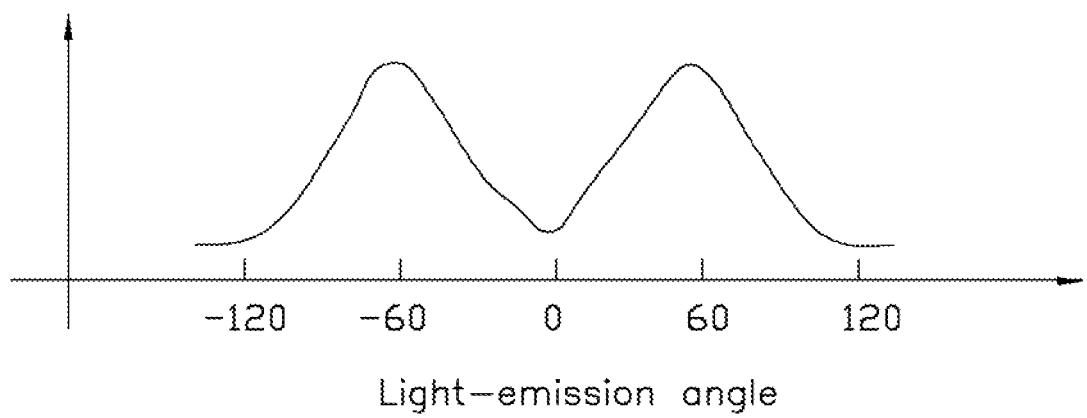
FIG. 4 is a coordinate graph showing light intensity vs. light-emission angle for the LED of FIG. 1.

FIG. 4 is a coordinate graph showing light intensity vs. light-emission angle for the LED 100. Since the curvature of the first reflective layer 151 is smaller than that of the second reflective layer 152, more light is reflected out of the LED 100 by the second reflective layer 152 with the light-emission angle of 60 degrees. When the light-emission angle is 60 degrees relative to the optical axis of the LED 100 (i.e., at 0 degree of the coordinate graph), the light intensity of light emitted out of the LED 100 has the maximum value. That is, the LED 100 has intensive light output at side directions thereof, rather than at a central direction thereof.

Figure 5:
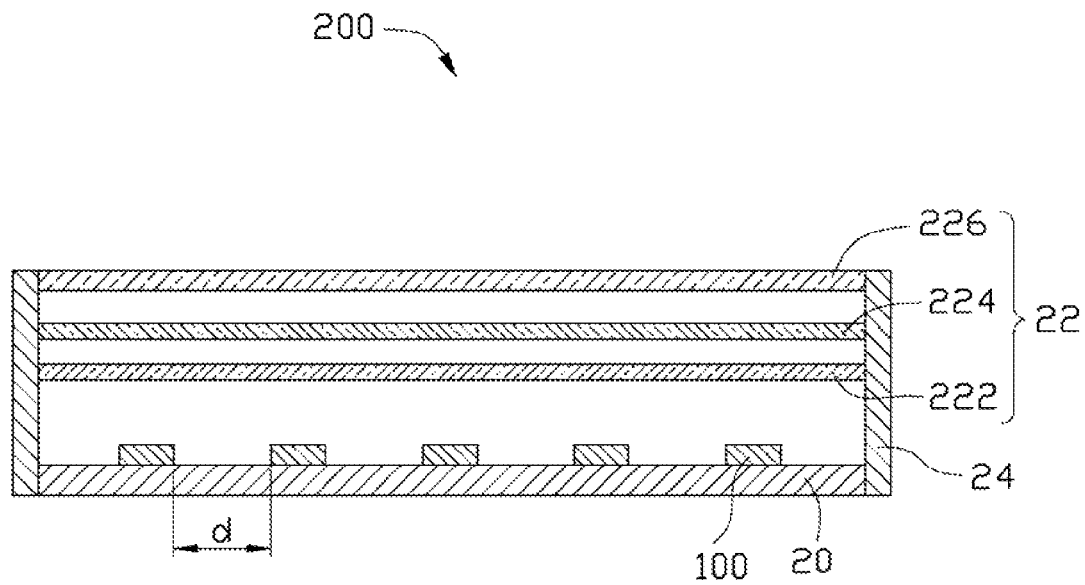
FIG. 5 is a cross-sectional view of a backlight module using the LED of FIG. 1.

FIG. 5 shows a direct type backlight module 200 applying the LED 100 disclosed above. The direct type backlight module 200 includes a frame 24, a backboard 20 mounted in a bottom of the frame 24, a plurality of LEDs 100 positioned on the backboard 20 at intervals and an optical assembly 22 received in the frame 24 and located over the LEDs 100. The optical assembly 22 includes three optical plates 222, 224, 226 which are spaced from each other.

In the direct type backlight module 200, since each LED 100 has intensive light output at side directions thereof, a distance d between two adjacent LEDs 100 can be increased, and the number of the LEDs 100 can be decreased. Thus, the cost of the LED module 200 can be reduced. Furthermore, heat generated from the LEDs 100 can be decreased, whereby the heat can be dissipated timely easier than the conventional direct type backlight module.

It is believed that the disclosure and its advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. An LED, comprising:
a base forming a concave recessed from a face thereof and a recess above the concave;
a reflective layer attached on the concave, the reflective layer comprising a first reflective layer and a second reflective layer, the first reflective layer being located at a center of the concave, the second reflective layer surrounding and connecting the first reflective layer, the first reflective layer having a curvature smaller than that of the second reflective layer;
an LED chip received in the recess and spaced from the reflective layer, the LED chip having a light output face facing towards the reflective layer;
a first electrode and a second electrode electrically connected to the LED chip; and
an encapsulating layer filled in the recess to cover the reflective layer and encapsulate the LED chip.

2. The LED of claim 1, wherein the first reflective layer and the second reflective layer are arc-shaped.

3. The LED of claim 2, wherein a position of the LED chip deviates from a focus of the first reflective layer.

4. The LED of claim 1, wherein a distance between the first reflective layer and the face of the base is not less than a distance between the second reflective layer and the face of the base.

5. The LED of claim 4, wherein the distance between the first reflective layer and the face of the base gradually decreases from the center of the concave to a periphery of the concave.

6. The LED of claim 5, wherein the distance between the second reflective layer and the face of the base gradually decreases along a direction away from the first reflective layer.

7. The LED of claim 6, wherein the distance between the first reflective layer and the face of the base has the minimum value at a point where the first reflective layer and the second reflective layer intersect.

8. The LED of claim 7, wherein the distance between the second reflective layer in and the face of the base has the maximum value at the point where the first reflective layer and the second reflective layer intersect.

9. The LED of claim 1, wherein each of the first electrode and the second electrode comprises a first section and a second section extending from the first section to be located over the recess, the second section having a width smaller than that of the first section.

10. The LED of claim 1, wherein light generated by the LED chip and radiates out of the LED has the maximum light intensity at 60 degrees relative to an optical axis of the LED.

11. An backlight module comprising:
a backboard;
an optical assembly located above the backboard; and
a plurality of LEDs positioned at the backboard at intervals, each LED comprising:
a base forming a concave recessed from a face thereof and a recess above the concave;
a reflective layer attached on the concave, the reflective layer comprising a first reflective layer and a second reflective layer, the first reflective layer being located at a center of the concave, the second reflective layer surrounding and connecting the first reflective layer, the first reflective layer having a curvature smaller than that of the second reflective layer;
an LED chip received in the recess and spaced from the reflective layer, the LED chip having a light output face facing towards the reflective layer; and
an encapsulating layer filled in the recess to cover the reflective layer and encapsulate the LED chip.

12. The backlight module of claim 11, wherein the first reflective layer and the second reflective layer are arc-shaped.

13. The backlight module of claim 12, wherein a position of the LED chip deviates from a focus of the first reflective layer.

14. The backlight module of claim 11, wherein a distance between the first reflective layer and the face of the base is not less than a distance between the second reflective layer and the face of the base.

15. The backlight module of claim 14, wherein the distance between the first reflective layer and the face of the base gradually decreases from the center of the concave to a periphery of the concave.

16. The backlight module of claim 15, wherein the distance between the second reflective layer and the face of the base gradually decreases along a direction away from the first reflective layer.

17. The backlight module of claim 16, wherein the distance between the first reflective layer and the face of the base has the minimum value at a point where the first reflective layer and the second reflective layer intersect.

18. The backlight module of claim 17, wherein the distance between the second reflective layer in and the face of the base has the maximum value at the point where the first reflective layer and the second reflective layer intersect.

19. The backlight module of claim 11, wherein light generated by the LED chip and radiates out of each LED has the maximum light intensity at 60 degrees relative to an optical axis of each LED.

* * * * *